(12) United States Patent
Mao et al.

(10) Patent No.: US 9,373,642 B2
(45) Date of Patent: Jun. 21, 2016

(54) THIN FILM TRANSISTOR AND METHOD FOR REPAIRING THE SAME, GOA CIRCUIT AND A DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Guoqi Mao, Beijing (CN); Xi Chen, Beijing (CN); Shengyu Su, Beijing (CN); Ranyi Zhou, Beijing (CN)

(73) Assignees: BOE TECHNOLOGY GROUP CO., LTD, Beijing (CN); BEIJING BOE DISPLAY TECHNOLOGY CO., LTD, Beijing (CN)

(*) Notice: Subject to any disclaimer, the term of this patent is extended or adjusted under 35 U.S.C. 154(b) by 0 days.

(21) Appl. No.: 14/526,356

(22) Filed: Oct. 28, 2014

(65) Prior Publication Data
US 2015/0372020 A1  Dec. 24, 2015

(30) Foreign Application Priority Data
Jun. 20, 2014 (CN) .......................... 2014 1 0280893

(51) Int. Cl.
H01L 27/12 (2006.01)
H01L 29/423 (2006.01)
H01L 29/417 (2006.01)

(52) U.S. Cl.
CPC ........ *H01L 27/1214* (2013.01); *H01L 27/1259* (2013.01); *H01L 29/41733* (2013.01); *H01L 29/42384* (2013.01)

(58) Field of Classification Search
CPC .................................................. G02F 1/136259
See application file for complete search history.

(56) References Cited

U.S. PATENT DOCUMENTS 7,750,372 B2 * 7/2010 Chang ........................... 257/202
2012/0026072 A1 * 2/2012 Chiu et al. ....................... 345/55

* cited by examiner

*Primary Examiner* — Robert Carpenter
(74) *Attorney, Agent, or Firm* — Blakely Sokoloff Taylor & Zafman LLP

(57) ABSTRACT

The present disclosure provides a thin film transistor and method for repairing the same, GOA circuit and a display device, which aims to solve the problem that the source and/or drain of thin film transistor can not be repaired once it is short circuited with other conductive functional layers. The thin film transistor comprises a source, a drain, and a gate. The source and the drain have a comb shape and respectively comprise a plurality of comb-tooth portions and comb-handle portions for connecting each comb-tooth portion, and the gate is insulated from the source and the drain. Comb-tooth portions of the source are arranged by an interval with respect to comb-tooth portions of the drain. The comb-handle portion of the source and the gate do not overlap in their projections in the vertical direction, and the comb-handle portion of the drain and the gate do not overlap in their projections in the vertical direction.

16 Claims, 2 Drawing Sheets

THIN FILM TRANSISTOR AND METHOD FOR REPAIRING THE SAME, GOA CIRCUIT AND A DISPLAY DEVICE

RELATED APPLICATIONS

The present application claims the benefit of Chinese Patent Application No. 201410280893.X, filed Jun. 24, 2014, the entire disclosure of which is incorporated herein by reference.

FIELD OF THE INVENTION

The present disclosure relates to the field of display, and particularly to a thin film transistor (TFT) and method for repairing the same, a Gate Driver On Array (GOA) circuit and a display device.

BACKGROUND ART

The switching elements in the filed of display plays an important role in a display device with a high display quality. For example, the conduction performance of a TFT which acts as the switching element directly influences the turning on performance of the TFT, deflection of liquid crystal molecules, and thus the quality of image display.

Nowadays, there is an increasingly strict requirement on a charging current of the TFT. Generally, the charging current can be increased by increasing a ratio between width and length of a channel of TFT. For example, specifically for a GOA circuit formed in a non-display area on an array substrate, the requirements for the charging current of TFT in the circuit are even stricter. Therefore, a TFT with a large area and charging current has been designed.

During fabricating the TFT, breakdown inevitably occurs due to electrostatic discharge (ESD) or dust particles falls onto some electrode in the TFT, resulting in a short circuit within the TFT. The TFT in which a short circuit occurs is generally repaired to restore its normal function. However, the construction of TFT will be affected or damaged during repairing. For example, a laser or other cutting approaches are used to repair a short circuit between the source and the gate, which tends to damage the structure of gate.

Due the design of TFT in the prior art, the TFT can not be repaired to operate normally. Since the abnormal TFT can not operate normally, image display of the display device will be affected.

SUMMARY

The present disclosure provides a thin film transistor (TFT) and a method for repairing the same, a GOA circuit and a display device, which can avoid or at least alleviate one or more problems in the prior art. For example, the technical solution of the present disclosure can solve the problem that the thin film transistor can not be repaired once a defect occurs.

To this end, the present disclosure provides a thin film transistor, comprising: a source, a drain, and a gate, the source and the drain having a comb shape and respectively comprising a plurality of comb-tooth portions and comb-handle portions for connecting each comb-tooth portion, and the gate being insulated from the source and the drain, wherein comb-tooth portions of the source are arranged by an interval with respect to comb-tooth portions of the drain, and wherein the comb-handle portion of the source and the gate do not overlap in their projections in the vertical direction, and the comb-handle portion of the drain and the gate do not overlap in their projections in the vertical direction.

According to the present disclosure, since the comb-handle portion of the source and/or drain and the gate do not overlap in their projections in the vertical direction, a connection region between the comb-tooth portions and the comb-handle portion of the source and/or drain and the gate do not overlap in their projections in the vertical direction. Thus, when a comb-tooth portion of the drain and/or source which is short circuited with the gate is cut off at the connection region, the construction of the gate will not be damaged. In this way, the repaired TFT can still operate normally, and image display of the display device is not affected.

The comb-handle portion of the source and the comb-handle portion of the drain can be belt-shaped comb-handle portions extending in a first direction which is perpendicular to the comb-tooth portion.

The gate can be a belt-shaped gate extending in the first direction.

The thin film transistor can further comprise a belt-shaped active layer extending in the first direction below the source and the drain, and a projection of the active layer in the vertical direction is located within the projection of the gate in the vertical direction.

Two edges of the belt-shaped active layer at both sides with respect to the first direction can extend to ends of comb-tooth portions of the source and ends of comb-tooth portions of the drain, respectively.

The distance from one edge of the belt-shaped active layer to the comb-handle portion of the source can equal to the distance from the other edge of the belt-shaped active layer to the comb-handle portion of the drain.

Comb-tooth portions of the source and comb-tooth portions of the drain can be arranged in parallel with each other, and the distance between two neighboring comb-tooth portions can be constant.

The thin film transistor can be a bottom gate type or a top gate type thin film transistor.

The present disclosure further provides a method for repairing the above-mentioned thin film transistor. When one or more comb-tooth portion of the source and/or drain of the thin film transistor is short circuited with the gate, said one or more comb-tooth portion of the source and/or drain which is short circuited with the gate can be at least disconnected from the comb-handle portion of the source and/or drain by a cutting process, wherein a cutting area of the cutting process is positioned at the connection region between the comb-handle portion and said one or more comb-tooth portion, and the connection region and the gate do not overlap in their projections in the vertical direction.

When one or more comb-tooth portion of the source of the thin film transistor is short circuited with the gate, said one or more comb-tooth portion of the source which is short circuited with the gate can be at least disconnected from the comb-handle portion of the source by a cutting process, wherein the cutting area of the cutting process is positioned at the connection region between the comb-handle portion and said one or more comb-tooth portion, and the connection region and the gate do not overlap in their projections in the vertical direction.

Alternatively, one or more comb-tooth portion of the drain of the thin film transistor is short circuited with the gate, said one or more comb-tooth portion of the drain which is short circuited with the gate can be at least disconnected from the comb-handle portion of the drain by a cutting process, wherein the cutting area of the cutting process is positioned at the connection region between the comb-handle portion and said one or more comb-tooth portion, and the connection region and the gate do not overlap in their projections in the vertical direction.

The method can further comprise: when one or more comb-tooth portion of the source of the thin film transistor is short circuited with the gate, disconnecting comb-tooth portions of the drain near said one or more comb-tooth portion of the source which is short circuited with the gate from the comb-handle portion of the drain by a cutting process, wherein a cutting area of the cutting process is positioned at the connection region between the comb-handle portion and said one or more comb-tooth portion, and the connection region and the gate do not overlap in their projections in the vertical direction.

The method can comprise: when one or more comb-tooth portion of the source of the thin film transistor is short circuited with the gate, disconnecting comb-tooth portions of the drain nearest to said one or more comb-tooth portion of the source which is short circuited with the gate from the comb-handle portion of the drain by a cutting process.

The method can further comprise: when one or more comb-tooth portion of the source of the thin film transistor is short circuited with the gate, disconnecting comb-tooth portions of the drain next nearest to said one or more comb-tooth portions of the source which is short circuited with the gate from the comb-handle portion of the drain by a cutting process.

The method can further comprise: when one or more comb-tooth portion of the drain of the thin film transistor is short circuited with the gate, disconnecting comb-tooth portions of the source near said one or more comb-tooth portion of the drain which is short circuited with the gate from the comb-handle portion of the source by a cutting process, wherein the cutting area of the cutting process is positioned at the connection region between the comb-handle portion and said one or more comb-tooth portion, and the connection region and the gate do not overlap in their projections in the vertical direction.

The method can comprise: when one or more comb-tooth portion of the drain of the thin film transistor is short circuited with the gate, disconnecting comb-tooth portions of the source nearest to said one or more comb-tooth portion of the drain which is short circuited with the gate from the comb-handle portion of the source by a cutting process.

The method can further comprise: when one or more comb-tooth portion of the drain of the thin film transistor is short circuited with the gate, disconnecting comb-tooth portions of the source next nearest to said one or more comb-tooth portion of the drain which is short circuited with the gate from the comb-handle portion of the source by a cutting process.

The present disclosure provides a GOA circuit which comprises the above-mentioned thin film transistor.

The present disclosure provides a display device which comprises the above-mentioned GOA circuit.

The present disclosure provides a thin film transistor, comprising: a source, a drain, and a gate, the source and the drain having a comb shape and respectively comprising a plurality of comb-tooth portions and comb-handle portions for connecting each comb-tooth portion, and the gate being insulated from the source and the drain, wherein comb-tooth portions of the source are arranged by an interval with respect to comb-tooth portions of the drain, and wherein the comb-handle portion of the source and the gate do not overlap in their projections in the vertical direction, and the comb-handle portion of the drain and the gate do not overlap in their projections in the vertical direction. Since the comb-handle portions of the source and the drain and the gate do not overlap in their projection in the vertical direction, cutting off the comb-tooth portions which are short circuited with the gate will not damage the construction of the gate, the repaired TFT will still operate normally, and image display of the display device will not be affected.

DETAILED DESCRIPTION OF EMBODIMENTS

Figure 1:
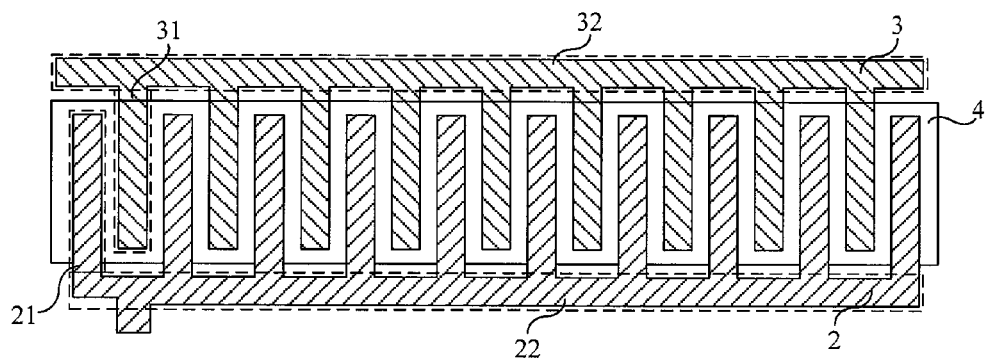
FIG. 1 is a top view illustrating a TFT of the present disclosure.

The present disclosure provides a thin film transistor (TFT) and a method for repairing the same, a GOA circuit, and a display device, for purpose of solving the problem that the thin film transistor can not be repaired once a defect occurs.

The present disclosure will be elucidated hereinafter in details with reference to the accompanying drawings and embodiments. Apparently, these embodiments only constitute some embodiments of the present disclosure. The scope of the present disclosure is by no means limited to embodiments as set forth herein.

For ease of reading, components are suffixed with corresponding reference numerals: 2 source; 3 drain; 4 gate; 5 active layer; 21 comb-tooth portions of source; 22 comb-handle portion of source; 31 comb-tooth portions of drain; 32 comb-handle portion of drain; and W width of active layer.

Reference is made to FIG. 1, which is a top view illustrating a TFT of the present disclosure. As shown in FIG. 1, the TFT at least comprises a comb shaped source 2 and a comb shaped drain 3 on a substrate. The source 2 comprises a plurality of comb-tooth portions 21 and a comb-handle portion 22 for connecting each comb-tooth portion 21. The drain 3 comprises a plurality of comb-tooth portions 31 and a comb-handle portion 32 for connecting each comb-tooth portion 31. The TFT further comprises a gate 4 which is insulated from the source 2 and the drain 3. The gate 4 can be located below or above the source 2 and the drain 3. Comb-tooth portions 21 of the source 2 and comb-tooth portions 31 of the drain 3 are arranged by an interval. The comb-handle portion 22 of the source 2 and the gate 4 do not overlap in their projections in the vertical direction, and the comb-handle portion 32 of the drain 3 and the gate 4 do not overlap in their projections in the vertical direction.

It is noted that projections of the comb-handle portion 22 of the source 2 and the gate 4 in the vertical direction refer to their projections in the same horizontal plane, and projections of the comb-handle portion 32 of the drain and the gate 4 in the vertical direction refer to their projections in the same horizontal plane.

Since the source and/or drain is a film or layer with a certain pattern, the wording "vertical direction" in the present disclosure can be understood as a direction perpendicular to a plane in which the source and/or drain lies, or a direction perpendicular to a plane in which the gate and/or active layer lies.

When the source and the drain are formed on the substrate, the vertical direction can also be understood as a direction perpendicular to a plane in which the substrate lies.

The TFT is not limited in its construction, and can be a bottom gate type or a top gate type. When the TFT is a bottom gate type, the gate lies below the source and the drain. When the TFT is a top gate type, the gate lies above the source and the drain. The TFT shown in FIG. 1 is a bottom gate type TFT.

As described above, the comb-tooth portions of the source and the drain are arranged by an interval. This only indicates that the comb-tooth portions of the source and the drain are arranged alternately, and it's neither intended to define the relative distance between comb-tooth portions of the source and the drain, nor to define whether the comb-tooth portions are parallel with each other.

The comb-tooth portion can generally be understood to have a strip shape.

The comb-tooth portions of the source and the drain which are arranged by an interval can be parallel with each other. The distance between two neighboring comb-tooth portions can be constant, i.e., the distance from any comb-tooth portion of the source to the comb-tooth portion of the neighboring drain is constant.

In the TFT of the present disclosure, the source 2 and the drain 3 have a comb shape construction, and comb-tooth portions 21 of the source 2 and comb-tooth portions 31 of the drain 3 are arranged by an interval. When the TFT is energized, a channel is formed between a comb-tooth portion 21 and a neighboring comb-tooth portion 31. Channels with a number of n+1 (n being a positive integer larger than 0) are formed between n comb-tooth portions 21 and n comb-tooth portions 31. As compared with a source and drain with a straight line shape or a source with a U shape in the prior art, a ratio between width and length of the channel is increased, which improves the conduction properties of TFT and increases the charging current of TFT.

Further, the comb-handle portion 22 of the source 2 and the comb-handle portion 32 of the drain 3 and the gate 4 do not overlap in their projections in the vertical direction. Namely, projections of the comb-handle portions 22, 32 of the source 2 and the drain 3 in the vertical direction are located outside the projection of the gate 4 in the vertical direction. From the point of view of fabrication process, the comb-handle portions 22, 32 of the source 2 and the drain 3 do not overlap the gate 4. When a defect occurs in the TFT and it is required to at least disconnect a certain comb-tooth portion 31 of the drain 3 from the comb-handle portion 32, the comb-tooth portion 31 of the drain 3 is disconnected at its connection area with the comb-handle portion 32, i.e., an end of the comb-tooth portion 31 which is close to the comb-handle portion 32 is disconnected from the comb-handle portion 32. Since the end of the comb-tooth portion 31 which is close to the comb-handle portion 32 or the end of the comb-handle portion 32 which is close to the comb-tooth portion 31 does not overlap the gate 4, the gate will not be damaged during the cutting process. Similarly, a defect occurs in the TFT and it is required to at least disconnect a certain comb-tooth portion 21 of the source 2 from the comb-handle portion 22, the comb-tooth portions 21 of the source 2 is disconnected at its connection area with the comb-handle portion 22, i.e., an end of the comb-tooth portion 21 which is close to the comb-handle portion 22 is disconnected from the comb-handle portion 22. Since the end of the comb-tooth portion 21 which is close to the comb-handle portion 22 or the end of the comb-handle portion 22 which is close to the comb-tooth portion 21 does not overlap the gate 4, the gate will not be damaged during the cutting process.

In the present disclosure, since the comb-handle portions of the source and the drain and the gate do not overlap in their projections in the vertical direction, cutting off the comb-tooth portion of the drain and/or source which is short circuited with the gate will not damage the gate. In this way, the repaired TFT will still operate normally, and image display of the display device will not be affected.

As shown in FIG. 1, the comb-handle portion 22 of the source 2 and the comb-handle portion 32 of the drain 3 can be belt-shaped comb-handle portions extending in a first direction perpendicular to the comb-tooth portions 21 or comb-tooth portions 31. Namely, the comb-tooth portions 21 and the comb-tooth portions 31 can extend in the same direction, the comb-handle portion 22 and the comb-handle portion 32 can extend in the same direction, and the comb-tooth portions 21, 31 can extend in a direction perpendicular to the direction in which the comb-handle portions 22, 32 extend.

Each two neighboring comb-tooth portions 21 of the source 2 together with the comb-handle portion 22 therebetween constitute a U shape structure. Each two neighboring comb-tooth portions 31 of the drain 3 together with the comb-handle portion 32 therebetween constitute a U shape structure.

In the context of the present disclosure, the belt shaped structure refers to a structure which extends in a direction, has a width in a direction perpendicular to the extending direction, and has a very small thickness, i.e., a planar shape structure.

The gate 4 can further be a belt-shaped gate extending in the first direction, i.e., the gate 4 extends in the same direction as that of the comb-handle portions 22, 32. The gate 4 and the comb-handle portions 22, 32 do not overlap in their projections in the vertical direction, and the gate 4 is a planar shape structure. Therefore, the width of the gate 4 in a direction perpendicular to the first direction does not exceed a vertical distance between the comb-handle portion 22 and the comb-handle portion 32. Generally, the width of the gate 4 is slightly smaller than the vertical distance between the comb-handle portion 22 and the comb-handle portion 32. Provided that the gate 4 is not damaged during cutting the comb-tooth portion 21 or the comb-tooth portion 31, the gate 4 can be close to the comb-handle portion 22 and the comb-handle portion 32 as much as possible.

Figure 2:
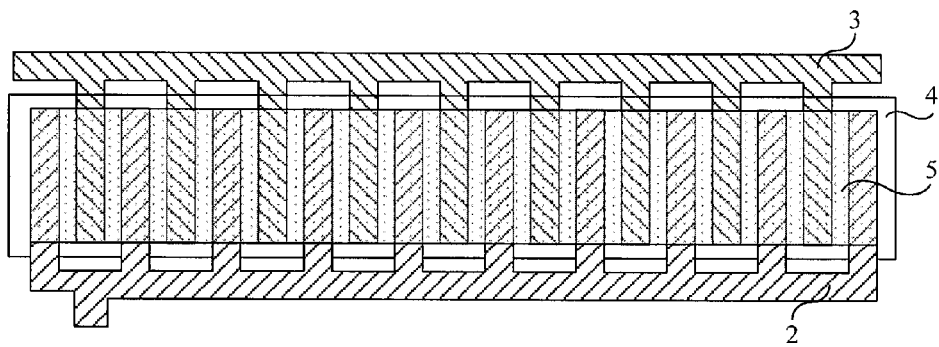
FIG. 2 is a top view illustrating another TFT of the present disclosure.

As shown in FIG. 2, the TFT can further comprise: a belt-shaped active layer 5 extending in the first direction below the source 2 and the drain 3. The projection of the active layer 5 in the vertical direction is located within the projection of the gate 4 in the vertical direction.

Figure 3:
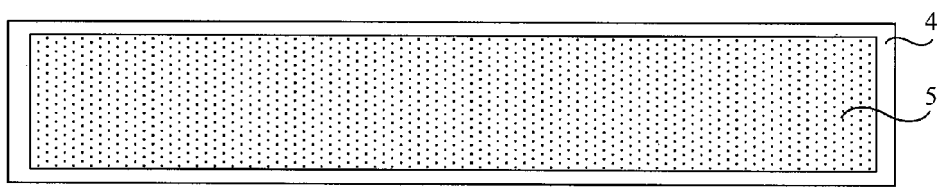
FIG. 3 is a top view illustrating a portion of a TFT of the present disclosure which only comprises a gate and an active layer.

In order to explain the position of the active layer 5 shown in FIG. 2, reference is made to FIG. 3, which is a top view illustrating a portion of a TFT of the present disclosure which only comprises the gate 4 and the active layer 5. The projection of the active layer 5 in the vertical direction is located within the projection of the gate 4 in the vertical direction. As stated above, since projections of the comb-handle portions 22, 32 of the source 2 and the drain 3 in the vertical direction are located outside the projection of the gate 4 in the vertical direction, projections of the comb-handle portions 22, 32 of the source 2 and the drain 3 in the vertical direction are also located outside the projection of the active layer 5 in the vertical direction. Thus, since the comb-handle portions of the source and the drain and the active layer do not overlap in their projections in the vertical direction in the present disclosure, cutting off a comb-tooth portion of the drain and/or source which is short circuited with the gate will not damage or destroy the active layer of the TFT.

Figure 4:
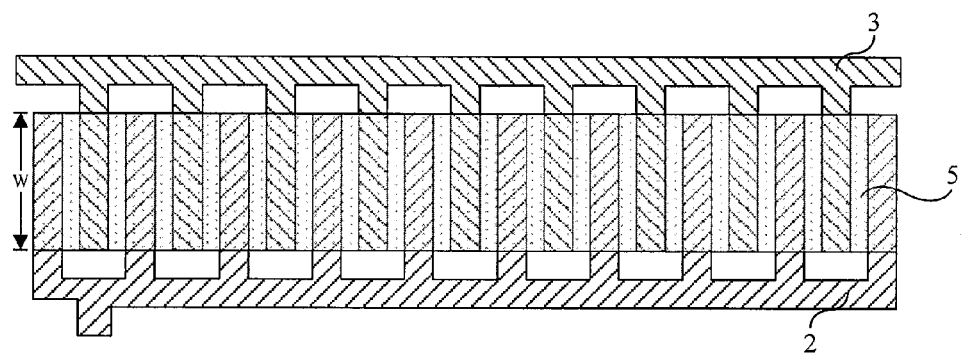
FIG. 4 is a top view illustrating a portion of a TFT of the present disclosure which only comprises an active layer, a source, and a drain.

Reference is made to FIG. 4, which is a top view illustrating a portion of a TFT of the present disclosure which only comprises the active layer 5, the source 2, and the drain 3. Two edges of the belt-shaped active layer 5 at both sides with respect to the extending direction extend to ends of the comb-tooth portions 21 of the source 2 which are away from the comb-handle portion 22 and ends of the comb-tooth portions 31 of the drain 3 which are away from the comb-handle portion 32, respectively. The length of the comb-tooth portions 21, 31 is slightly larger than a width W of the active layer 5 in a direction perpendicular to the extending direction. When the overlapping region between the comb-tooth portions 21, 31 and the active layer 5 has a maximum area, the width of channel reaches a maximum value. When the length of the channel (i.e., a vertical distance between a comb-tooth portion 21 and a neighboring comb-tooth portion 31) is fixed, the ratio between width and length of the channel reaches a maximum value. As compared with TFT in the prior art, the charging speed of the present TFT is further improved.

Figure 5:
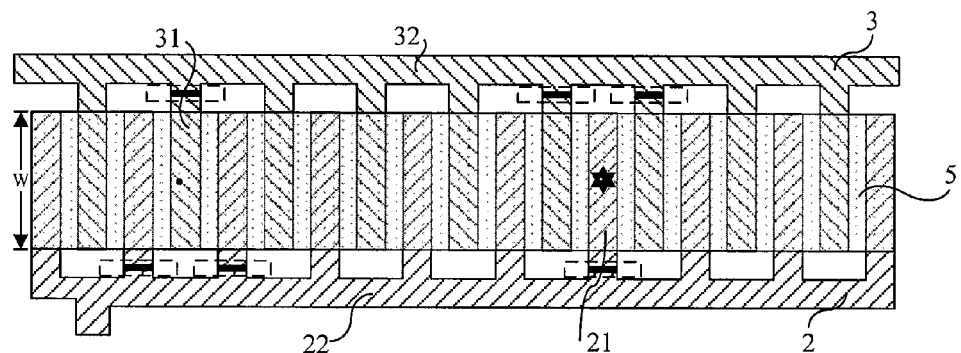
FIG. 5 is a top view illustrating a TFT with a short circuited defect of the present disclosure.

Reference is made to FIG. 5, which is a top view illustrating a TFT with a short circuited defect of the present disclosure. For simplicity, the active layer 5 is shown in FIG. 5, while the gate 4 is not shown. The dark spot and hexagram in FIG. 5 indicate the position of short circuit between the drain 3 and the gate 4 and between the source 2 and the gate 4. For example, the dark spot indicates a short circuit between the drain 3 and the gate 4 due to a dust particle, while the hexagram indicates a short circuit between the source 2 and the gate 4 due to electrostatic discharge (ESD). The short circuit mentioned in the present disclosure is not limited to the two types mentioned herein, and can also be any short circuit due to other reasons.

FIG. 5 schematically illustrates a case in which the comb-tooth portion 31 of the drain 3 in which the short circuit occurs and two comb-tooth portions 21 of the source 2 nearest to said comb-tooth portion 31 are cut off. As further schematically illustrated in FIG. 5, the comb-tooth portion 21 of the source in which the short circuit occurs and two comb-tooth portions 31 of the drain 3 nearest to said comb-tooth portion 21 are cut off.

It is apparent that the cutting area neither overlaps the gate 4, nor overlaps the active layer 5. Thus, cutting off the comb-tooth portion 21 and/or the comb-tooth portion 31 will not damage the gate 4 and the active layer 5. Since cutting does not damage the construction of the gate, the repaired TFT will still operate normally, and image display of the display device will not be affected.

In the present disclosure, each comb-tooth portion 21 in the source 2 can have the same length, and each comb-tooth portion 31 in the drain 3 can have the same length.

Each comb-tooth portion 21 in the source 2 can have the same length as that of each comb-tooth portion 31 in the drain 3.

In the present disclosure, the distance from one edge of the active layer 5 to the comb-handle portion 22 of the source equals to the distance from the other edge of the active layer 5 to the comb-handle portion 32 of the drain.

The TFT of the present disclosure provides can be suitably applied to any TFT in which a relatively large charging current is required. As compared with the conventional TFT with only one channel, the TFT of the present disclosure has a relatively large area, making it suitable for a circuit in a peripheral area of non-display area, such as a GOA circuit. In the GOA circuit provided with a TFT of the present disclosure, a gate scanning signal will be transmitted at a higher speed, which facilitates improvement of the response speed of the display device.

In the present disclosure, during repairing the TFT shown in FIG. 5, the comb-tooth portion 21 of the source 2 in which a short circuit occurs is at least disconnected from the comb-handle portion 22 at the end close to the comb-handle portion 22. As shown in FIG. 5, a horizontal line "—" at an end of the comb-tooth portion 21 which is close to the comb-handle portion 22 indicates an area at which the comb-tooth portion 21 will be cut. In specific implementations, cutting can be performed at areas as shown by dashed boxed in FIG. 5, for disconnecting the comb-tooth portion 21 from the comb-handle portion 22. Once the comb-tooth portion 21 of the source 2 in which the short circuit occurs has been cut off, comb-tooth portions 31 of the drain 3 near the comb-tooth portion 21 can be cut off, for preventing conduction between the comb-tooth portions 31 of the drain 3 near the comb-tooth portion 21 and the gate 4. For example, two comb-tooth portions 31 nearest to the comb-tooth portion 21 can be cut off. Alternatively, two comb-tooth portions 31 next nearest to the comb-tooth portion 21 can further be cut off. In specific implementations, whether a comb-tooth portion 31 is cut off and the number of comb-tooth portions 31 to be cut off are determined as required, which is not limited herein.

The method for repairing a TFT of the present disclosure is explained hereinafter by referring to FIG. 5. As shown in FIG. 5, when one or more comb-tooth portion 21 of the source 2 in the TFT is short circuited with the gate 4, said one or more comb-tooth portion 21 of the source 2 which is short circuited with the gate 4 is at least disconnected from the comb-handle portion 22 of the source 2 by a cutting process. A cutting area of the cutting process is positioned at a connection region between the comb-handle portion 22 and the comb-tooth portion 21, and the connection region and the gate 4 do not overlap in their projections in the vertical direction.

As shown in FIG. 5, when one or more comb-tooth portion 31 of the drain 3 in the TFT is short circuited with the gate 4, said one or more comb-tooth portions 31 of the drain 3 which is short circuited with the gate 4 is at least disconnected from the comb-handle portion 32 of the drain 3 by a cutting process. The cutting area of the cutting process positioned at the connection region between the comb-tooth portions 31 of the drain 3 and the comb-handle portion 32 of the drain, and the connection region and the gate 4 do not overlap in their projections in the vertical direction.

Further, as shown in FIG. 5, when one or more comb-tooth portion 21 of the source 2 in the TFT is short circuited with the gate 4, the method can further comprise: at least disconnecting comb-tooth portions 31 of the drain 3 near said one or more comb-tooth portion 21 of the source 2 which is short circuited with the gate 4 from the comb-handle portion 32 of the drain 3 by a cutting process. The cutting area of the cutting process positioned at the connection region between the comb-tooth portion 31 and the comb-handle portion 32, and the connection region and the gate 4 do not overlap in their projections in the vertical direction.

Further, as shown in FIG. 5, when one or more comb-tooth portion 31 of the drain 3 in the TFT is short circuited with the gate 4, the method can further comprise: at least disconnecting comb-tooth portions 21 of the source 2 near said one or more comb-tooth portion 31 of the drain 3 which is short circuited with the gate 4 from the comb-handle portion 22 of the source 2 by a cutting process. The cutting area of the cutting process positioned at the connection region between the comb-handle portion 22 and comb-tooth portion 21, and the connection region and the gate 4 do not overlap in their projections in the vertical direction.

The TFT of the present disclosure provides the following beneficial effects. The TFT has a relatively large area and charging current. In addition, in the TFT, a defect caused by a short circuit between the local structure in the source and/or drain and other functional layer can be repaired easily.

Therefore, the TFT is not limited in its field of application. For example, it can be applied to the display field or other semiconductor field, and particularly to a liquid crystal display, an organic light emitting display, and a GOA circuit. Namely, the TFT is discussed in the present disclosure by taking its application to the GOA circuit as an example. However, the TFT of the present disclosure can further be applied to other types of circuits or devices which suffer from the problems as discussed herein.

The present disclosure further provides a GOA circuit, which comprises the TFT of the present disclosure.

The present disclosure provides a display device, which comprises the TFT of the present disclosure or comprises the above mentioned GOA circuit.

The display device can be such electronic device as a liquid crystal display, a liquid crystal TV, a liquid crystal notebook computer, an organic light emitting display, and a flexible display.

Although the present disclosure has been described above with reference to specific embodiments, it should be understood that the limitations of the described embodiments are merely for illustrative purpose and by no means limiting. Instead, the scope of the disclosure is defined by the appended claims rather than by the description, and all variations that fall within the range of the claims are intended to be embraced therein. Thus, other embodiments than the specific ones described above are equally possible within the scope of these appended claims.

The invention claimed is:

1. A thin film transistor, comprising a source, a drain, and a gate, the source and the drain having a comb shape and respectively comprising a plurality of comb-tooth portions and comb-handle portions for connecting each comb-tooth portion, the gate being insulated from the source and the drain, and an active layer below the source and the drain,
wherein comb-tooth portions of the source are arranged by an interval with respect to comb-tooth portions of the drain, and
wherein the comb-handle portion of the source and the gate do not overlap in their projections in the vertical direction, and the comb-handle portion of the drain and the gate do not overlap in their projections in the vertical direction,
wherein a projection of the active layer in the vertical direction is located within a projection of the gate in the vertical direction, and
wherein two edges of the active layer at both sides with respect to its extending direction extend to ends of the comb-tooth portions of the source and ends of the comb-tooth portions of the drain, respectively.

2. The thin film transistor of claim 1, wherein the comb-handle portion of the source and the comb-handle portion of the drain are belt-shaped comb-handle portions extending in a first direction which is perpendicular to the comb-tooth portions.

3. The thin film transistor of claim 2, wherein the gate is a belt-shaped gate extending in the first direction.

4. The thin film transistor of claim 2, wherein the active layer extends in the first direction and is belt shaped.

5. The thin film transistor of claim 4, wherein the distance from one edge of the belt-shaped active layer to the comb-handle portion of the source equals to the distance from the other edge of the belt-shaped active layer to the comb-handle portion of the drain.

6. The thin film transistor of claim 1, wherein comb-tooth portions of the source and comb-tooth portions of the drain are arranged in parallel with each other, and the distance between two neighboring comb-tooth portions is constant.

7. The thin film transistor of claim 1, wherein the thin film transistor is a bottom gate type or a top gate type thin film transistor.

8. A method for repairing the thin film transistor of claim 1, wherein when one or more comb-tooth portion of the source and/or drain of the thin film transistor is short circuited with the gate, at least disconnecting said one or more comb-tooth portion of the source and/or drain which is short circuited with the gate from the comb-handle portion of the source and/or drain by a cutting process, wherein a cutting area of the cutting process is positioned at the connection region between the comb-handle portion and said one or more comb-tooth portion, and the connection region and the gate do not overlap in their projections in the vertical direction.

9. The method of claim 8, further comprising: when one or more comb-tooth portion of the source of the thin film transistor is short circuited with the gate, disconnecting comb-tooth portions of the drain near said one or more comb-tooth portion of the source which is short circuited with the gate from the comb-handle portion of the drain by a cutting process, wherein the cutting area of the cutting process is positioned at the connection region between the comb-handle portion and said one or more comb-tooth portion, and the connection region and the gate do not overlap in their projections in the vertical direction.

10. The method of claim 9, wherein when one or more comb-tooth portion of the source of the thin film transistor is short circuited with the gate, disconnecting comb-tooth portions of the drain nearest to said one or more comb-tooth portion of the source which is short circuited with the gate from the comb-handle portion of the drain by a cutting process.

11. The method of claim 10, further comprising: when one or more comb-tooth portion of the source of the thin film transistor is short circuited with the gate, disconnecting comb-tooth portions of the drain next nearest to said one or more comb-tooth portions of the source which is short circuited with the gate from the comb-handle portion of the drain by a cutting process.

12. The method of claim 8, further comprising: when one or more comb-tooth portion of the drain of the thin film transistor is short circuited with the gate, disconnecting comb-tooth portions of the source near said one or more comb-tooth portion of the drain which is short circuited with the gate from the comb-handle portion of the source by a cutting process, wherein the cutting area of the cutting process is positioned at the connection region between the comb-handle portion and said one or more comb-tooth portion, and the connection region and the gate do not overlap in their projections in the vertical direction.

13. The method of claim 12, wherein when one or more comb-tooth portion of the drain of the thin film transistor is short circuited with the gate, disconnecting comb-tooth portions of the source nearest to said one or more comb-tooth portion of the drain which is short circuited with the gate from the comb-handle portion of the source by a cutting process.

14. The method of claim 13, further comprising: when one or more comb-tooth portion of the drain of the thin film transistor is short circuited with the gate, disconnecting comb-tooth portions of the source next nearest to said one or more comb-tooth portion of the drain which is short circuited with the gate from the comb-handle portion of the source by a cutting process.

15. A GOA circuit, comprising the thin film transistor of claim 1.

16. A display device, comprising the GOA circuit of claim 15.

* * * * *